United States Patent [19]

Houston

[11] Patent Number: 5,600,274
[45] Date of Patent: Feb. 4, 1997

[54] CIRCUIT AND METHOD FOR COMPENSATING VARIATIONS IN DELAY

[75] Inventor: Theodore W. Houston, Richardson, Tex.

[73] Assignee: Texas Instruments Incorporated, Dallas, Tex.

[21] Appl. No.: 993,502

[22] Filed: Dec. 17, 1992

Related U.S. Application Data

[63] Continuation of Ser. No. 807,006, Dec. 13, 1991, abandoned.

[51] Int. Cl.[6] .......................... H03H 11/26; H03K 17/14; H03K 5/02; H03K 3/00
[52] U.S. Cl. .......................... 327/262; 327/264; 327/378; 327/172; 327/108
[58] Field of Search .................................. 307/270, 591, 307/595, 597, 602, 603, 605, 265, 471, 491, 571, 572, 573, 606; 328/55, 66; 327/262, 264, 378, 172, 108

[56] References Cited

U.S. PATENT DOCUMENTS

| | | | |
|---|---|---|---|
| 4,424,460 | 1/1984 | Best | 307/471 |
| 4,473,762 | 9/1984 | Iwahashi et al. | 307/591 |
| 4,504,749 | 3/1985 | Yoshida | 307/603 |
| 4,583,008 | 4/1986 | Grugett | 328/55 |
| 4,684,823 | 8/1987 | Dayton et al. | 307/247.1 |
| 4,710,653 | 12/1987 | Yee | 328/55 |
| 4,742,254 | 5/1988 | Tomisawa | 307/606 |
| 4,755,704 | 7/1988 | Flora et al. | 307/591 |
| 4,797,585 | 1/1989 | Segawa et al. | 328/55 |
| 4,845,390 | 7/1989 | Chan | 307/605 |
| 5,047,660 | 9/1991 | Kannegundla et al. | 307/270 |
| 5,255,130 | 10/1993 | Buchan et al. | 307/265 |

*Primary Examiner*—David C. Nelms
*Assistant Examiner*—Trong Phan
*Attorney, Agent, or Firm*—Ira S. Matsil; Peter Barndt; Richard Donaldson

[57] ABSTRACT

A compensation circuit 10 is disclosed herein. The circuit includes a control circuit 14 including a delay element 18 with a delay sensitive to at least one parameter which causes variations in delay and also comprises a compensated driver circuit 16. The compensated driver circuit 16 has a control input B coupled to the control circuit 14 and a signal input C coupled to an input circuit 12. The delay of an output signal OUT of the compensated driver circuit 16 is controlled in part by the control circuit 14 which modifies the delay of the output signal OUT in response to variation of the parameter. Other systems and methods and numerous variations are also disclosed.

29 Claims, 7 Drawing Sheets

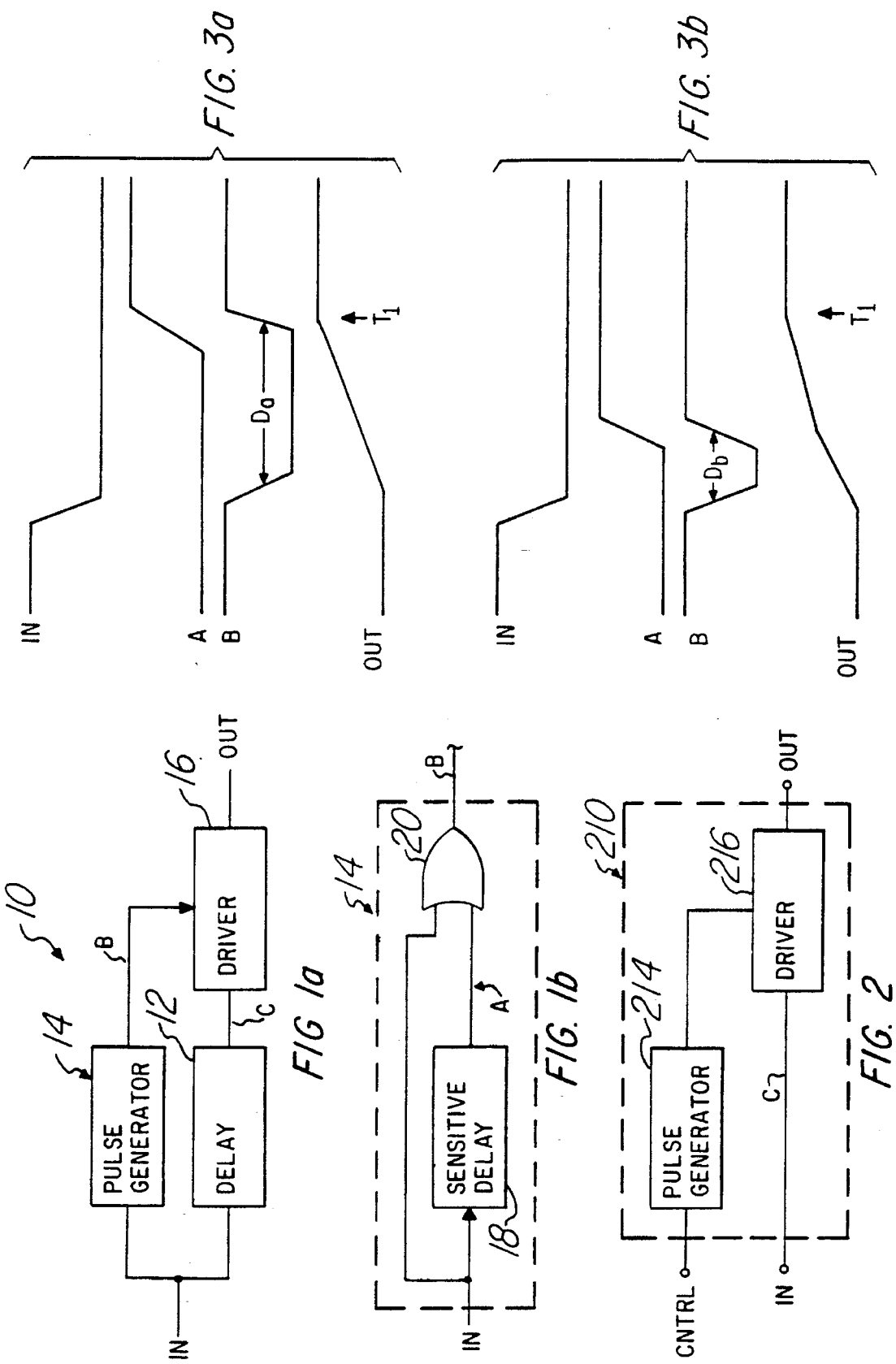

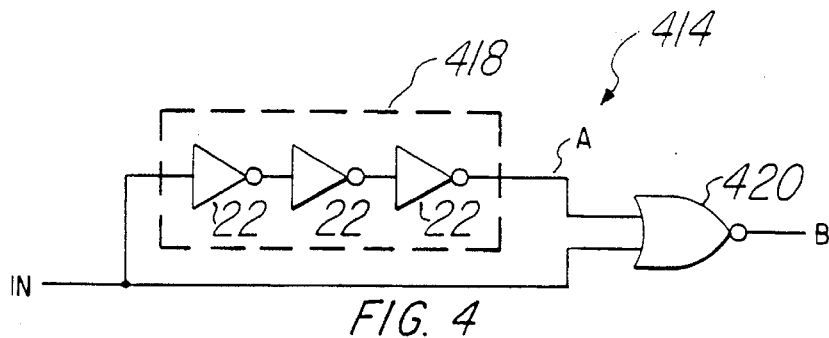
FIG. 4
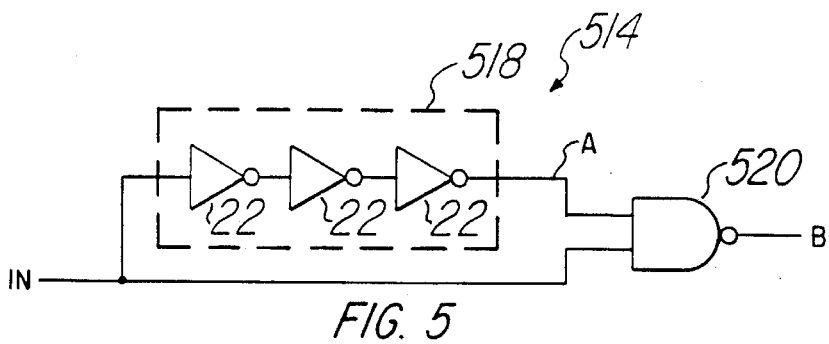
FIG. 5
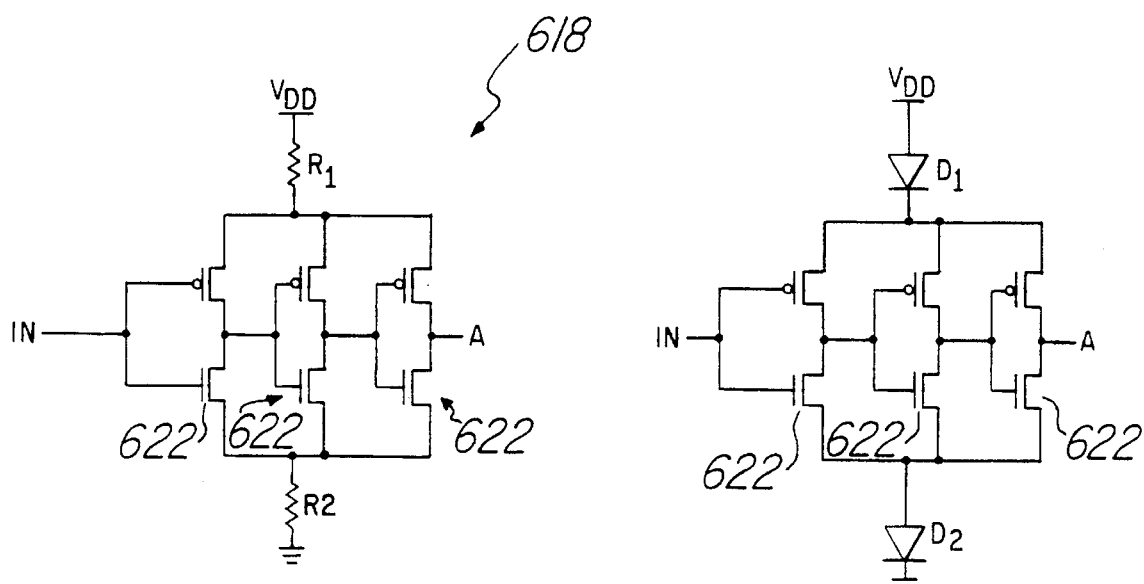
FIG. 6a
FIG. 6b

CIRCUIT AND METHOD FOR COMPENSATING VARIATIONS IN DELAY

This application is a continuation of application Ser. No. 07/807,006, filed Dec. 13, 1991 now abandoned.

FIELD OF THE INVENTION

This invention generally relates to semiconductor devices and specifically to a delay compensation circuit.

BACKGROUND OF THE INVENTION

In many integrated circuits, it is necessary to introduce delay in the propagation of some signal, or to slow the switching time of some signal. For example, delay may be introduced in input circuitry to allow for skew among input signals, or the input transition to a large driver, such as an output buffer, may be slowed so as to reduce sudden changes in current that would affect supply voltages.

Also, for most integrated circuit applications, the circuit must operate for some range of parameter, such as temperature or supply voltage, and the speed of transitions vary with these parameters. Then, when the deliberately introduced delay is designed to be adequate for the values of the variable parameters that give the fastest response, said deliberately introduced delay will be excessive for the values of the variable parameters that give the slowest response.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for a delay compensation circuit.

A compensation circuit is disclosed herein. The circuit includes a control circuit including a delay element with a delay sensitive to at least one parameter which causes variations in delay (such as one or more of temperature, supply voltage and transistor gate length). The circuit also includes a compensated driver circuit. The compensated driver circuit has a control input coupled to the control circuit and a signal input coupled to an input circuit. The delay of an output signal of the compensated driver circuit is controlled in part by the control circuit which modifies the delay of the output signal in response to variation of the parameter.

In one embodiment the compensated driver comprises a primary driver and a compensating element. For example, the compensating element may be a load element such as a bleed-off transistor or a resistor in parallel with a transistor. In another example, the compensating element comprises a boost transistor. In yet another example, the compensating element comprises first and second transistors coupled in series where the first transistor is controlled by the control circuit and the second transistor is controlled by the input signal. In still another example, the compensating element comprises a tri-state driver.

In addition, the input circuit may comprise a delay element or a short that is, an element with practically no delay. The control circuit may comprise a pulse generator. In one example, the pulse generator comprises a delay element with a delay sensitive to the parameter and a logic gate such as a NAND gate or a NOR gate. In another example, the pulse generator comprises a first delay element with a first delay, a second delay element with a second delay (the second delay more sensitive to the parameter than the first delay), and a logic element.

A delay compensation circuit is disclosed herein. The circuit includes a delay circuit with a delay sensitive to at least one parameter which causes variations in delay such as temperature, supply voltage or gate length. A pulse generator circuit coupled to the input signal. The length of a pulse generated by the pulse generator corresponds to the variation in delay caused by the parameter. A driver circuit is provided with a control input coupled to the pulse generator and with an signal input coupled to the delay circuit. The delay of the output of the driver circuit is controlled in part by the length of the generated pulse.

Also disclosed is a method for compensating the delay of a driver circuit. In this situation, the delay varies due to at least one parameter such as gate length, supply voltage or temperature. A first input signal is coupled to the driver circuit and a second input signal to a pulse generator circuit. The width of an output pulse created by the pulse generator is proportional to the length of the delay of the driver circuit. This output pulse is provided as a control input of the driver circuit such that the delay of a signal output by the driver circuit is controlled by the width of the output pulse.

Circuitry is disclosed to compensate for the effect of some parameter on the performance of some primary circuit. The compensation circuitry includes a delay circuit or element that is sensitive to the parameter, and compensation is accomplished by controlling the drive current or load at some portion of the primary circuit. In one embodiment, the compensation circuitry includes a pulse generator circuit, the duration of the generated pulse being sensitive to the delay of the delay circuit or element, and the controlled load or drive current being sensitive to the duration of the pulse. In another embodiment, the delay circuit or element delays a control signal in controlling the load or drive current. Several example delay, load, and drive circuits or elements are disclosed.

In one aspect, the essence of the invention is using a delay circuit or element that is sensitive to some parameter to control a load or drive circuit or element to compensate for the effect of the parameter on some primary circuit. The delay element can be used in a pulse generator, but does not need to be (e.g., FIGS. 17 and 18).

The compensation circuit may be used to compensate for signal with high-to-low transitions, low-to-high transitions or both. The system may be used as the input of a driver circuit such as in memory arrays or to create a constant width pulse, as two examples.

An advantage of the invention is that it provides a delay circuit which will be have a constant, repeatable delay even as operating conditions vary.

BRIEF DESCRIPTION OF THE DRAWINGS

The above features of the present invention will be more clearly understood from consideration of the following descriptions in connection with accompanying drawings in which:

FIGS. 1a–1b is a block diagram representation of a first embodiment delay circuit;

FIG. 2 is a block diagram representation of a second embodiment delay circuit;

FIGS. 3a–3b are timing diagrams demonstrating an exemplary use of the present invention;

FIGS. 4–5 are schematic representations of first embodiment pulse generator circuits;

FIGS. 6a–6b is a schematic representation of a first embodiment sensitive, inverting delay circuit;

Corresponding numerals and symbols in the different figures refer to corresponding parts unless otherwise indicated.

DETAILED DESCRIPTION OF PREFERRED EMBODIMENTS

Figure 7:
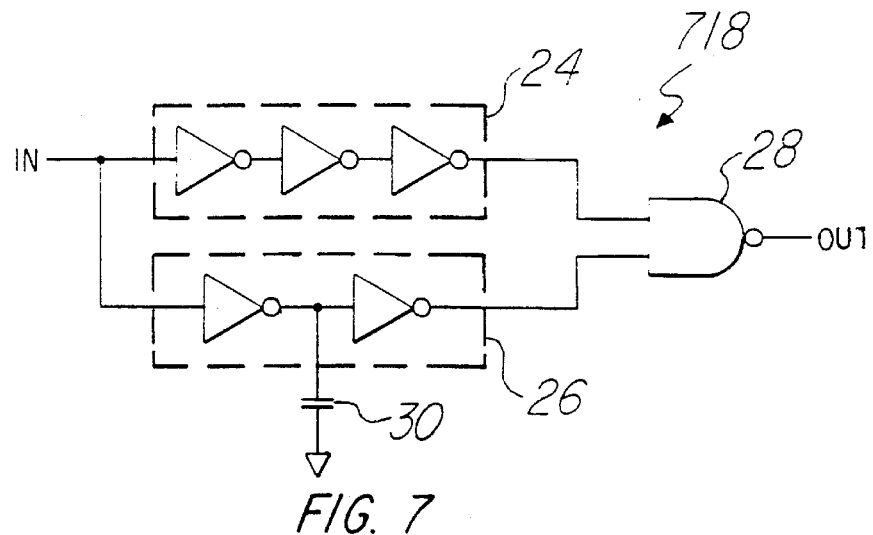
FIGS. 7–9 are alternate embodiment pulse generator circuits.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. Block diagrams of the preferred embodiment will be described first followed by a time diagram to illustrate the operation of the circuit. Several examples of each of the components will then be presented along with a description of modifications. A brief discussion on the combination of elements will then be presented followed by several alternate embodiments. Finally there will be a general summary concluding with two example applications for using the invention.

The object of the first embodiment is to have a delay for an input high-to-low transition that is relatively insensitive to variation in some parameter. (Signals with low-to-high transitions as well as signals with both transitions may also be compensated.) The idea is to have a pulse generator that generates a pulse upon an input transition from high to low, where the pulse turns off an extra load (or provides an extra drive) to a node in the primary delay circuit. The slower the transitions, the longer the pulse and thus the longer the extra load is turned off (or extra drive is turned on). The concept can be used to compensate for variations in parameters such as supply voltage, temperature or gate length. This concept will be better understood with reference to the figures described below.

Referring first to FIG. 1a, a first embodiment delay circuit 10 is illustrated in schematic form. The delay circuit 10 includes a delay portion 12 as well as a pulse generator circuit 14 both of which are provided input signal IN. The output of the pulse generator 14 is coupled to a control input of a compensated, driver circuit 16 which is coupled between the output of the delay 12 and the output signal OUT. Further details of specific delay circuit 12, pulse generator 14 and driver 16 will be discussed below.

In the embodiment illustrated in FIG. 1a, the pulse generator 14 may be thought of as a control circuit while the delay circuit 12 and the driver circuit 16 may be thought of as a compensated driver circuit. In one case the delay circuit 12 may have practically no delay, i.e., may be a short.

An exemplary pulse generator 14 is illustrated in FIG. 1b. The pulse generator 14 includes a sensitive delay with inversion 18 and an OR gate 20 which are connected together to provide a pulse generator responsive to high-to-low transitions. The sensitive delay 18 is designed to be sensitive to the parameter(s) over which variations in delay are to be controlled (e.g., supply voltage, temperature, or gate length).

An alternate embodiment configuration is illustrated in FIG. 2. In the embodiment a control signal CNTRL is coupled to the input of pulse generator 214. The output of the pulse generator is coupled to a control input of a driver circuit 216. The output of driver 216 is coupled between the signal to be compensated and the output node. In other words, the input signal IN will enter circuit 210 uncompensated and the output signal OUT will in turn be compensated. In this embodiment, the pulse generator 214 may be thought of as a control circuit and the driver 216 may be thought of as a compensated driver.

It should be noted that the circuits of FIGS. 1a and 2 would be the same if the delay element 12 of FIG. 1a is a short that is, an element with practically no delay, and the inputs CNTRL and IN of FIG. 2 are tied together.

The operation of the circuit of FIG. 1a (including FIG. 1b) will be better understood by reference to FIGS. 3a and 3b which illustrate timing diagrams for an exemplary input pulse for two cases with varying parameters. For example, the supply voltage may be lower for the case illustrated in FIG. 3a than for the case illustrated in FIG. 3b. Of course, in an ideal situation the supply voltage would always be constant. However, in practical situations this is not true. Further, a single integrated circuit may be designed for multiple systems with different supply voltages.

The goal of the circuit (e.g., FIG. 1a) is to control how the speed of the signal OUT responds to changes in the variable parameter. In FIG. 3, the output signal OUT reaches a high value at the same time for both situations. Other applications could require over or under compensation.

Input signal IN includes a high-to-low transition. The signal A (i.e., the output of sensitive delay circuit 18) is an inverted and delayed version of the input signal IN. The delay of signal A is designed so that it is particularly sensitive to the parameter(s), e.g., supply voltage, temperature and/or gate length, which cause the delay of circuit 12 to vary. The degree of sensitivity is one of the design parameters to determine the degree of compensation.

The output of OR gate 20 will be low when signals IN and A are both low. This is illustrated as signal B. When signal B is low, the driver circuit 16 will more strongly drive the output OUT high either because of decreased load or increased drive. The amount of time that the compensation portion of the driver circuit 16 is active, i.e., the length of pulse B, is directly related to parameter sensitive delay circuit 12. In other words, if the delay between the input pulse IN and the output of compensation delay 12 is longer, then the pulse in signal B will be longer. This point is illustrated in FIGS. 3a and 3b wherein the delay $D_a$ for the low supply voltage case is longer than the delay $D_b$ for the high supply voltage case. In this manner, the delay of the output signal OUT may be repeatably controlled despite varying external parameters such as power supply voltage (or temperature or gate length). In this example, the output signal OUT reaches a high value at substantially time $T_1$ for both cases. In other words, the original goal has been achieved.

As described above, for this embodiment the idea is that node OUT is a "slow" node on which delay from a low-to-high transition is to be kept constant. The negative pulse from the pulse generator C will control the compensation portion of the driver circuit. The requirement in the design of the compensating delay element 18 is that the pulse approximately encompass the transition time of node D at the slow "corner" of the variable parameters being compensated, and not fully encompass the transition time for faster parameter combinations.

As illustrated in FIGS. 4 and 5, several variations of the pulse generator circuit 414 (514) are possible. In these examples, the sensitive delay 418 (518) is illustrated as a serially connected chain of inverters 22. A specific sensitive delay circuit will be described in more detail with reference to FIG. 6 below.

In the example illustrated in FIG. 4, the output of NOR gate 420 will be high when both the input signal IN and the output A of sensitive delay 418 are low, resulting in a pulse at B when the input transitions from high-to-low. In other words, a high-to-low transition will be compensated and the compensation portion of the driver circuit 16 will be active when its input is high.

For the example illustrated in FIG. 5, the output of NAND gate 520 will be low when both the input signal IN and the output A of sensitive delay 4 18 are high resulting in a pulse at B when the input transitions from high-to-low. In other words, a low-to-high transition will be compensated and the compensation portion of driver circuit 16 will be active when its input is low. As will be obvious to those skilled in the art, other logic gates may be used for other combinations of which transition (high-to-low or low-to-high) and when to activate driver circuit 16.

An exemplary inverting, sensitive delay circuit 618 is illustrated in FIG. 6a. The circuit includes three CMOS inverters 622 coupled in series. Although illustrated with three inverters, any odd number of inverters may be used. The drains of the P-channel transistors are coupled to a supply voltage (e.g., $V_{DD}=5$ V) through resistor $R_1$. Likewise, the drains of the n-channel transistors are coupled to a reference voltage (e.g., ground or zero volts) through resistor $R_2$. In a preferred embodiment, the resisters $R_1$ and $R_2$ have a positive temperature coefficient. In addition, the transistors may have shorter gate lengths than those in the delay circuit 12 and/or the drive circuit 16. These factors will aid in compensating for temperature and gate length variations.

In an alternate embodiment illustrated in FIG. 6b, the resistors $R_1$ and $R_2$ may be replaced with diodes $D_1$ and $D_2$. The diodes are configured such that current flows from the supply voltage to the inverters and from the inverters to the reference voltage. This example provides compensation for variation in supply voltage and temperature variation.

Other elements can be used to adjust the delay of delay circuit 18, including capacitance, current loads, and R-C delay. The requirement on delay element 18 is that the resulting pulse be long enough in the slow corner and short enough in fast corner of parameter space, where short enough and long enough are relative to the transition time of the compensated node, such that the resulting transition of the output is as desired. The requirement to have a delay that is relatively slower in the slow corner and relatively faster in the fast corner is generally an easier design problem than the other way around. The design problem is also eased by having the compensated node have a relatively slow transition to allow space for the control pulse to be long or short relative to the transition. This will generally be the case for nodes that control large drivers where L di/dt needs to be limited. This can also be made the case where a deliberate delay is being introduced, such as to match an allowance for input skew.

Selective use of minimum gate length and longer than minimum gate length in the n and p channel devices in the inverters and NOR or NAND gate can be chosen to create the desired effects on pulse width (e.g. longer or shorter for rising or falling input transitions) for gate length variation.

In addition to making the delay of 18 more sensitive to parameter variation than a typical circuit, it is also possible to make the primary input to the compensated node less sensitive. For example, referring to FIG. 1a, if gate length is the parameter of concern, the transistors of delay 12 driving node C can be made longer than minimum while the transistors of pulse generator 14 and driver 16 are minimum. Then, if the gate lengths are all reduced, the drive of C by 12 would be increased, but not by as much as the change in the compensating pulse on B. Some ways to make the delay 12 relatively insensitive to some variations include use of resistors with negative temperature coefficient, Miller capacitance, gate oxide capacitance, and gate lengths longer than minimum.

There is, however, a limited amount that can be done to make a delay more or less sensitive to parameter variations. For the pulse compensation described above to have a significant effect, the variation of the pulse in signal B must be different enough from the variation of the delay circuit 12 that is being compensated. Greater sensitivity can be obtained by creating a pulse from the difference in delay of two paths, one designed to be relatively insensitive to parameter variation, the other to be relatively sensitive. If the two delays are near equal at one corner, the difference in delay will be very sensitive to the parameter variation. The difference can be made to be longer at either the fast or the slow corner by choosing the corner at which the delays are balanced.

An example of this principle is illustrated by the pulse generator 718 in FIG. 7. In this case a parameter insensitive delay 24 at the slow corner and a parameter sensitive delay 26 are coupled to the input of a NAND gate 28. A capacitor 30 is provided for added delay. The delay of sensitive delay 26 will match the delay of insensitive delay 24 at the fast corner and be slower than insensitive delay 24 at the slow corner. As a result, there is no pulse at the fast corner but there is a pulse on a high-to-low going input at the slow corner.

Figure 8:
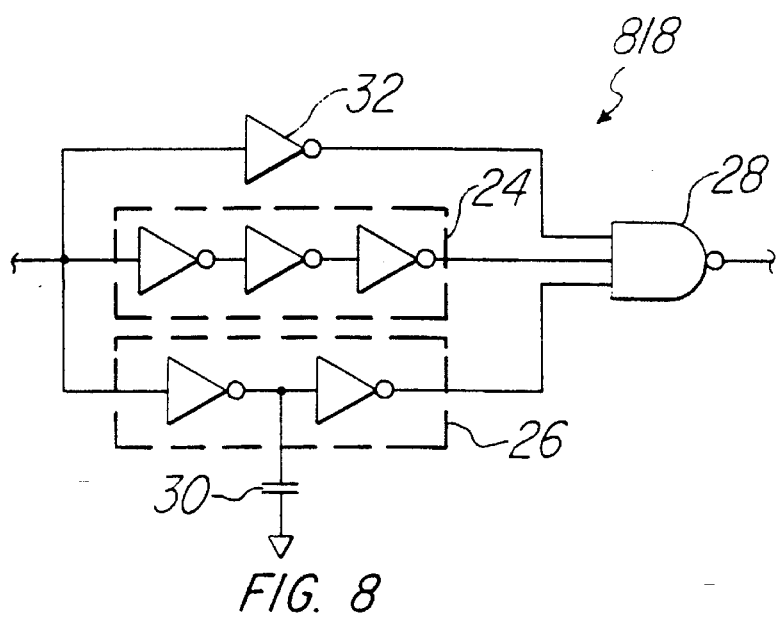

It should be noted that this circuit will also give a pulse on a low-to-high input at faster than the nominal fast corner where balanced. This would effectively give a "bleed" (slow-down) at the very fast parameters for the opposite direction. This may not create a problem and in fact may even be desirable. If not, extra logic (e.g., an inverter 32 coupled to NAND gate 28 and in parallel to delays 24 and 26 as illustrated in FIG. 8) could be used.

Figure 9:
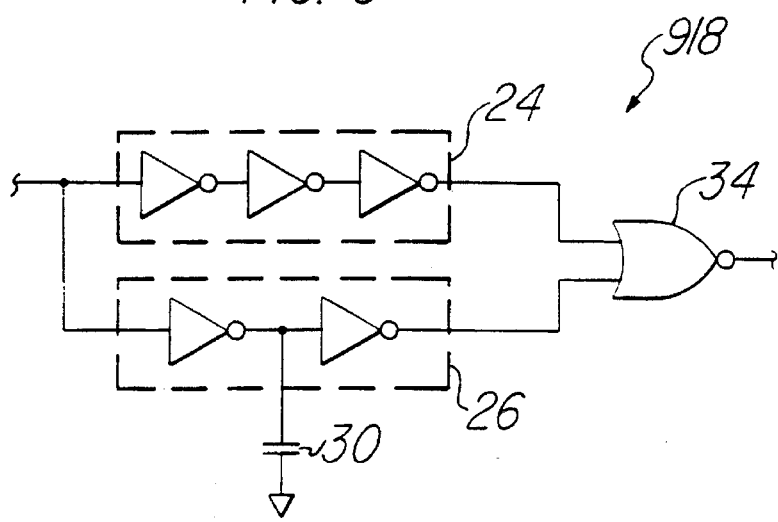

Similarly, the circuit of FIG. 9 provides a pulse generator for a positive-going pulse. The delays are the same as described above and are input into NOR gate 34. This circuit will provide a positive going pulse for an input going from high to low at the fast corner. This is similar to the NAND circuit of FIG. 9 except it is for the opposite going input transition and gives an opposite sign pulse.

The above embodiments are examples of ways to use the difference in delay in two circuits to create a pulse, the duration of which is particularly sensitive to the change in some parameter. Other techniques are also possible. For example, a circuit could generate two pulses, each with a different delay. These two pulses would then be combined to create a pulse based on the difference in duration of the two the pulses.

Several driver circuit 16 embodiments are illustrated in FIGS. 10 through 14. These figures illustrate two possible methods to compensate the delay. In the first, the idea is to have the pulse generator generate a pulse where the pulse turns off an extra load to the output node. This is referred to herein as the bleed-off method. In the second method, which is the currently preferred method, a boost transistor is used rather than the bleed-off transistor. Here, instead of controlling an extra load in the primary delay circuit, the pulse from the pulse generator controls an extra drive in the primary delay circuit.

Figure 10:
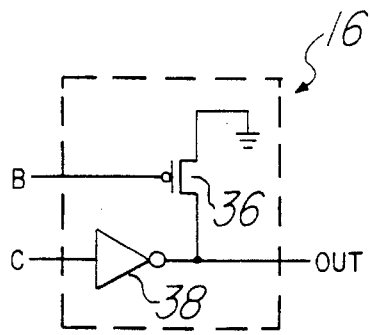
FIGS. 10, 11a–11b, 12–13 and 14a–14b are schematic representations of compensated driver circuits.

Referring now to FIG. 10, a driver circuit to compensate a low-to-high transition signal is provided. In the circuit, a PMOS transistor 36 has its drain coupled to a reference voltage (e.g., ground) and its source coupled to the output of inverter 38. The input of inverter 38 is coupled to input signal C (which comes from delay circuit 12 in FIG. 1a). A control signal B (i.e., the output of pulse generator 14) is coupled to the gate of PMOS transistor 36.

When the control signal B is high (i.e., the pulse generator 14 is supplying a pulse), the PMOS bleed-off transistor 36 will be off, that is will be non-conductive. The output node will be driven high faster when the bleed-off transistor 36 is off. The amount of time the bleed-off transistor is off (i.e., the length of pulse B) is directly related to parameter sensitive delay circuit 18. In this manner, the delay of the output signal OUT may be repeatably controlled despite varying external parameters such as power supply voltage, temperature or gate length.

Figure 11A:
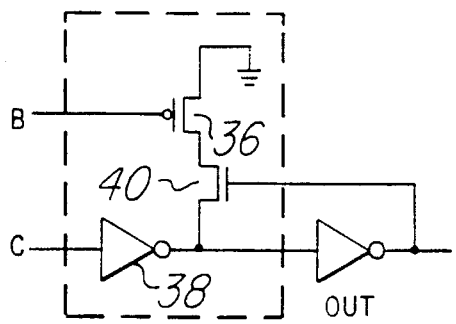

A variation of the bleed-off configuration of FIG. 10 is shown in FIG. 11a. In this embodiment, a NMOS transistor 40 is inserted in the connection between the source of bleed-off transistor 36 and the delayed node C. The gate of NMOS transistor 40 is coupled to the inverse of the output signal OUT. The transistor 40 is inserted to turn off static power.

Figure 11B:
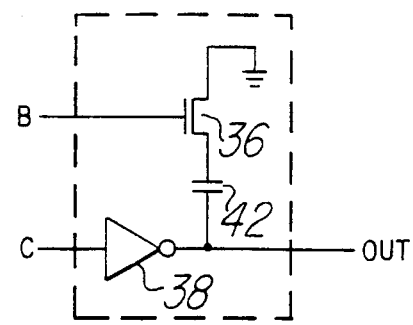

In an alternate embodiment illustrated in FIG. 11b, the NMOS transistor 40 is replaced with a capacitor 42 which is coupled between the drain of transistor 18 and node C. The capacitor 42 will prevent DC power dissipation.

The bleed-off driver circuits illustrated in FIGS. 10 and 11 will compensate delays in a low-to-high transition. An alternate embodiment (not illustrated) to compensate additional delay for a high-to-low transition may also be formed. This circuit would be identical to that of FIG. 10 except PMOS transistor 36 would be replaced with an NMOS transistor and the NMOS transistor would be coupled to a supply voltage rather than ground. The operation of the circuit which compensates high-to-low transitions is analogous to that of FIG. 10 with all the voltage polarities reversed. Other configurations, for example to use an n-channel transistor for the low-to-high transition or a p-channel transistor for the high-to-low transition, are also possible.

Figure 12:
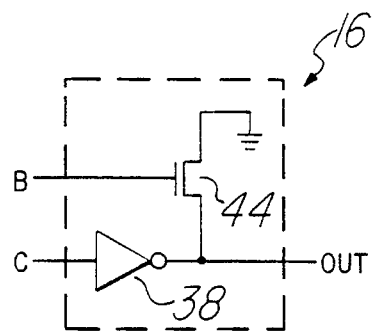

An example of a boost driver for a high-to-low transition is illustrated in FIG. 12. As shown, an NMOS transistor 44 has its source coupled to a reference voltage and its drain coupled to the input signal C (which comes from delay circuit 12 in FIG. 1a). A control signal B (i.e., the output of pulse generator 14) is coupled to the gate of NMOS transistor 44. An inverter 38 is also provided between the input and the output of the driver.

In this case, the boost transistor 44 is on, i.e., conductively coupling node C to ground, when the pulse A is high. Once again, as the delay of parameter sensitive circuit 18 becomes longer, the pulse width of pulse A will be longer and therefore the boost transistor 44 will be on longer which will aid in keeping the delay at node C constant.

Although not illustrated here, the circuit of FIG. 12 may be modified in a manner similar to the way FIG. 10 was modified in the discussion above. In other words, to compensate a low-to-high transition, NMOS boost transistor 44 which is coupled to ground would be replaced with a PMOS boost transistor (not shown) coupled to a power supply voltage. Once again, the operation of the circuit which compensates low-to-high transitions is analogous to that of FIG. 12 with all the voltage polarities reversed. In addition, elements to prevent DC power dissipation may also be included as discussed above.

Figure 13:
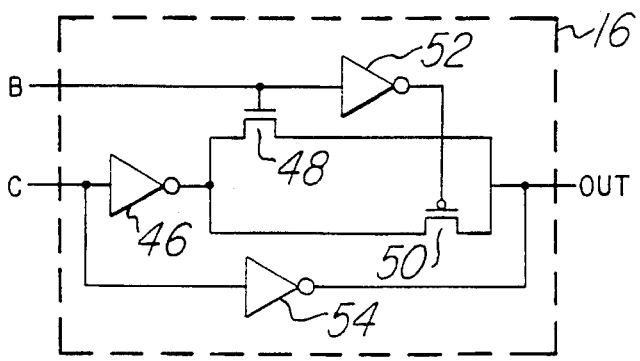

Another approach is to have the control pulse control a tri-state driver connected in parallel with another driver. One embodiment of this approach is illustrated in FIG. 13. The driver circuit 16 is used for compensation of either high-to-low, low-to-high transition, or both, depending on the pulse B.

In this configuration, the input C is coupled to an inverter 46 and an inverter 54. The output of inverter 46 is coupled to the sources of NMOS transistor 48 and PMOS transistor 50. The drains of the transistors are coupled to the output along with the output of inverter 54. The control signal B is coupled to the gate of NMOS transistor 48 and the gate of PMOS transistor 50 (through inverter 52).

When a signal B is high, the drive of inverter 46 will boost the transition of OUT. On the other hand, when B is low, the transition of OUT will be driven by inverter 54 alone. While a full complementary pass gate is shown in FIG. 13, a simple n-channel or p-channel pass gate could be used, particularly if a boost is wanted for only a low-to-high or high-to-low transition.

Figure 14A:
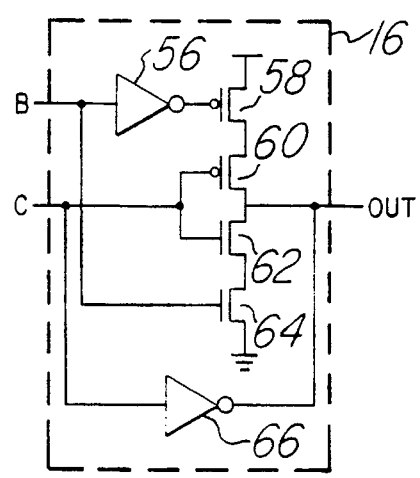

Another driver circuit is illustrated in FIG. 14a. In this configuration, the input signal C is coupled to the gates of PMOS transistor 60 and NMOS transistor 62 as well as the input of inverter 66. The control signal B is coupled to the gate of NMOS transistor 64 and to the gate of PMOS transistor 58 through inverter 56.

When B is high, the transition of OUT will be boosted either high or low depending on signal IN. On the other hand, when B is low, the transition of OUT will be driven by inverter 66 alone. If compensation is wanted for only one direction of the transition, only half of the tri-state driver (i.e., either PMOS transistors 58 and 60 or NMOS transistors 62 and 64) is needed.

Figure 14B:
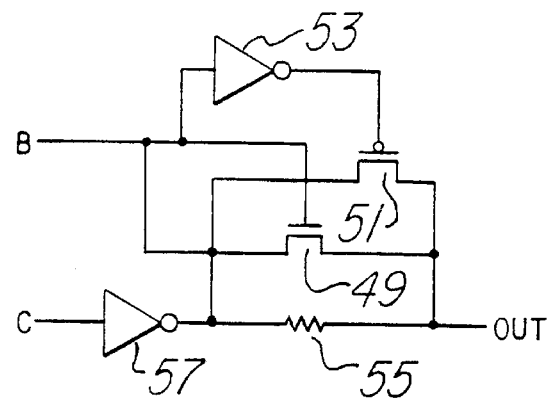

Yet another approach is to have the control pulse control the conductivity of a pass gate in parallel or series with some delay or load element, such as a resistor. FIG. 14b illustrates an embodiment in which pass gates 49 and 51 are in parallel with a resistor 55. When control pulse B is high, the pass gate is conductive and the delay in drive of OUT is reduced.

Each of the various elements in the circuit were discussed individually above to demonstrate the fact that the design of the compensation circuit may be performed by mixing and matching the various elements. Without undue experimentation, various combinations of pulse generators and driver circuits may be formed to obtain the desired circuit. FIGS.

15 and 16 illustrate just two of the many possible combinations.

Figure 15:
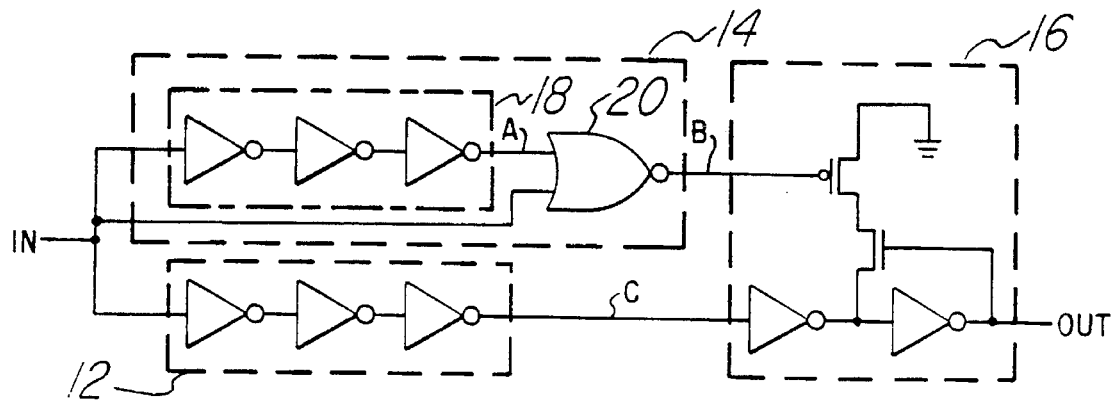
FIGS. 15–16 provide examples of how the various components can be combined to form a circuit as illustrated in FIG. 1.

For example, FIG. 15 circuit comprises a pulse generator 14 such as the one illustrated in FIG. 4 and a driver circuit such as the one illustrated in FIG. 11a. In this example, the delay 12 includes three series inverters.

Figure 16:
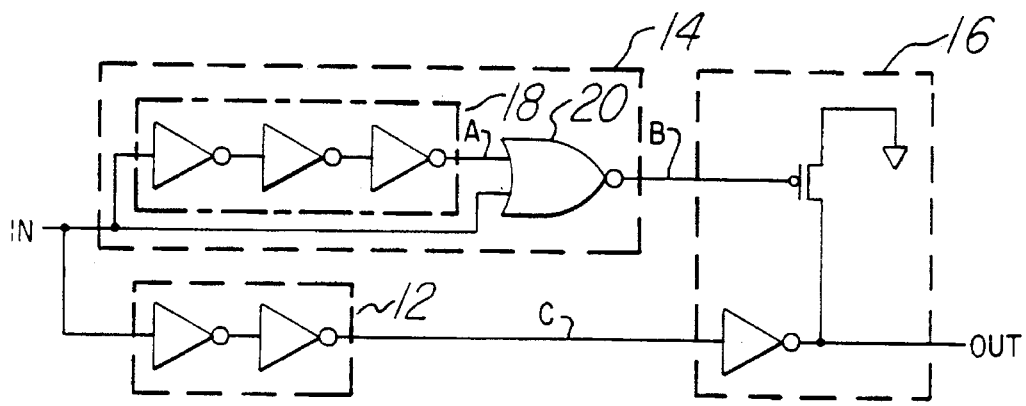

Likewise, FIG. 16 circuit comprises a pulse generator 14 such as the one illustrated in FIG. 4 and a driver circuit such as the one illustrated in FIG. 12. In this example, the delay 12 includes two series inverters.

Figure 17:
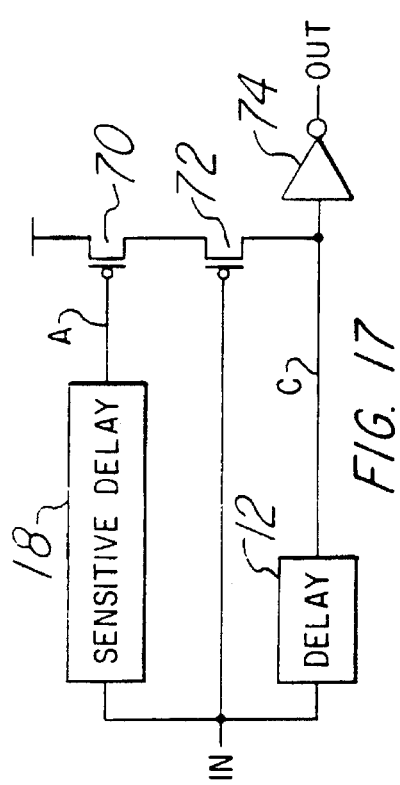
FIGS. 17–18 are alternate embodiment delay compensation circuits.

Referring now to FIG. 17, yet another embodiment is illustrated schematically. In this case, the output A of delay circuit 18 is coupled to the gate of PMOS boost transistor 70. The source of the boost transistor 70 is coupled to a power supply voltage which may be 5 volts for example.

Also included in the embodiment of FIG. 17 is a second boost transistor 72. The second boost transistor 72 has its source coupled to the drain of first boost transistor 70 and its drain coupled to output node C. In this embodiment, the two transistors 70 and 72 can be thought of as a compensating element.

The circuit of FIG. 17 operates similarly to those discussed above. For a high-to-low transition input, when both IN and A are low, i.e., the period of the delay of parameter sensitive circuit 18, both boost transistors 70 and 72 are conductive and therefore the power supply voltage is coupled to node C. Once again, the illustrated embodiment gives a boost to C for a period as long as the delay from IN to A.

Figure 18:
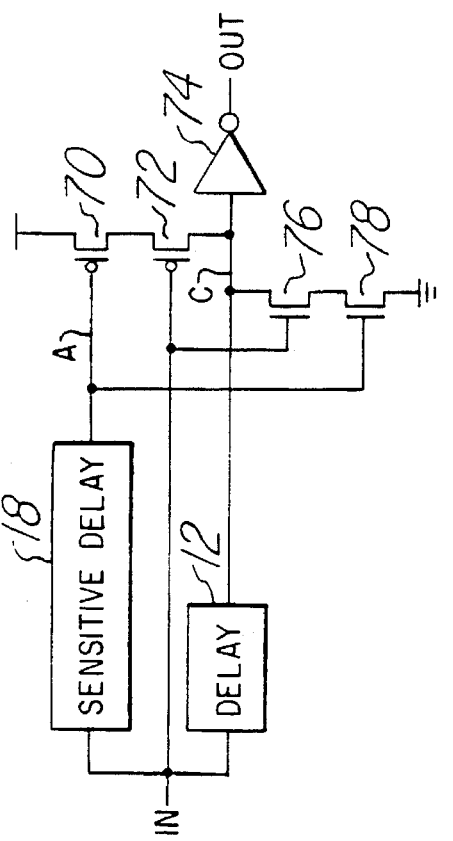

This concept can be expanded to delays in both directions as illustrated in FIG. 18. The circuit shown in FIG. 18 comprises the same elements as the circuit shown in FIG. 17 but additionally includes NMOS boost transistors 76 and 78. Transistor 76 is coupled between the node C and transistor 78 and transistor 632 is coupled between the transistor 76 and a reference voltage, for example ground. The gate of transistor 76 is coupled to the input signal IN and the gate of transistor 78 is coupled to node A.

The boost transistors 70 and 72 provide a boost for a high-to-low transitioning pulse as described above. Likewise, the boost transistors 76 and 78 provide a boost for low-to-high transitioning pulse in a manner analogous to that described above.

Once again, it is noted that for these approaches to be effective, the delay in the pulse generator portion 18 should be more sensitive to the parameter variation than is the primary drive of the transition to be compensated. For example, shorter gate lengths are more sensitive to gate length variation and circuits with a stepped down voltage (e.g., by diode drops) are more sensitive to voltage variation.

Figure 19A:
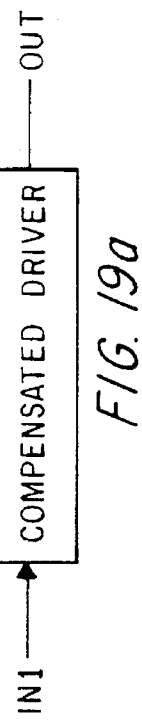
FIGS. 19a–19b are general block diagrams of delay compensation circuits.
Figure 19B:
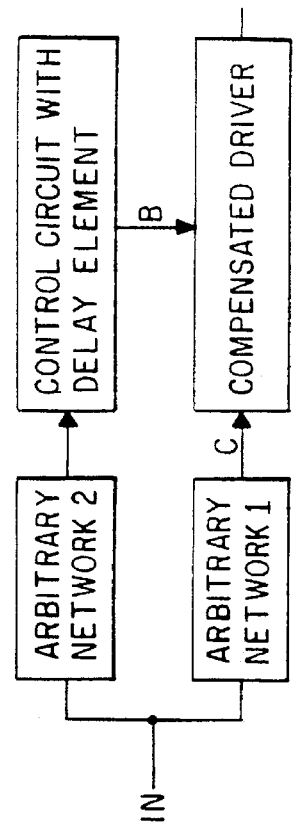

In summary, two generalized block diagrams are illustrated in FIGS. 19a and 19b. In the general embodiment of FIG. 19a a first input signal IN1 is applied to compensated driver. A second input IN2 is applied to a control circuit with delay element which creates a pulse B. The output signal OUT is a compensated version of IN1 which depends upon the pulse B.

The general embodiment of FIG. 19b illustrates the connection of input signals to create a single input IN. The input signal IN is coupled into arbitrary networks which for example may be a delay or simply a short that is, an element with practically no delay. The output of the arbitrary networks are then input to the control circuit and compensated driver to get compensated output OUT.

Figure 20:
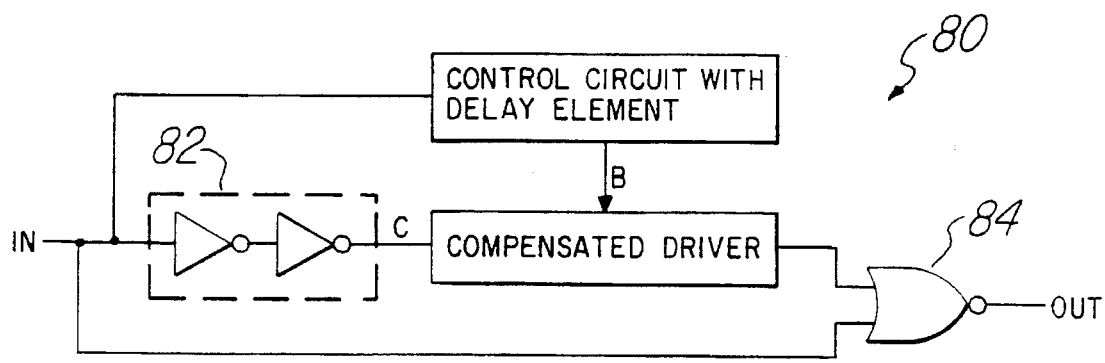
FIGS. 20–21 are block diagrams of exemplary applications.
Figure 21:
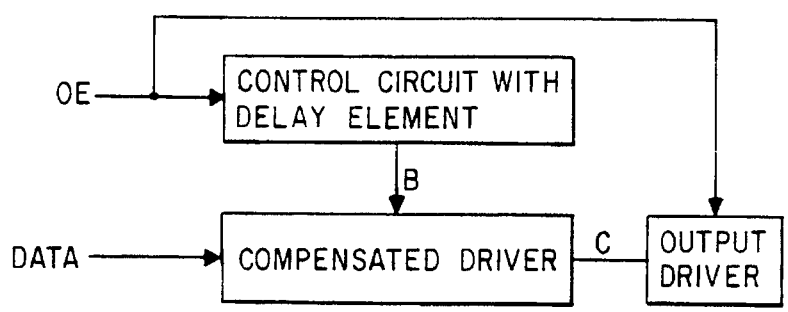

FIGS. 20 and 21 are now presented to give two examples of the many uses for a compensated driver. FIG. 20 is an example application to form a compensated pulse generator 80. In this circuit a pulse will be generated whenever the input IN transitions from a high to low level. The number of inverters in delay 82 may be varied but should be even, assuming the compensated driver is inverting. In other embodiments, the NOR gate 84 may be replaced by other logic gates including NAND, AND, OR or XOR as examples. In addition, the delay 82 may be inverting and the various modifications to the control circuit with delay element and the compensated driver may be utilized.

Referring now to FIG. 21, an example application of the invention to an output buffer is provided. This example assumes the output enable signal OE will be synchronized with the timing of data becoming valid. Here it may be desirable to have the compensated driver over-compensated, i.e., faster at the slow corner than the fast corner, to compensate for variation in drive of the output driver.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A compensation circuit comprising:

a control circuit for receiving a control signal, said control circuit including a pulse generator circuit which generates a pulse upon a transition within said control signal, wherein the width of said pulse output by said control circuit is sensitive to variations caused by at least one parameter which causes variations in delay;

a compensated driver circuit with a control input coupled to said control circuit and with a signal input coupled to an input circuit, wherein the delay of an output signal of said compensated driver circuit is affected by the width of said pulse output by said control circuit thereby modifying the delay of said output signal in response to variations of said at least one parameter.

2. The circuit of claim 1 wherein said compensated driver comprises a primary driver coupled to a compensating element, said compensating element being coupled to a reference voltage node and also having at least one input from said control circuit.

3. The circuit of claim 2 wherein said compensating element is a load element.

4. The circuit of claim 3 wherein said load element comprises a bleed-off transistor.

5. A compensation circuit comprising:

a control circuit including a pulse generator circuit wherein the width of a pulse output by said control circuit is sensitive to variations caused by at least one parameter which causes variations in delay; and a compensated driver circuit with a control input coupled to said control circuit and with a signal input coupled to an input circuit, said compensated driver comprises a primary driver coupled to a compensating load element, said compensating load element comprising a resistor in parallel with a transistor and having at least one input from said control circuit;

wherein the delay of an output signal of said compensated driver circuit is ;effected by the width of said pulse output by said control circuit thereby modifying the delay of said output signal in response to variations of said at least one parameter.

6. The circuit of claim 2 wherein said compensating element comprises a boost transistor.

7. A compensation circuit comprising:

a control circuit including a pulse generator circuit wherein the width of a pulse output by said control circuit is sensitive to variations caused by at least one parameter which causes variations in delay; and a compensated driver comprising a primary driver coupled to a compensating element, said compensating element comprising first and second transistors coupled in series, said first transistor being controlled by said control circuit and said second transistor being controlled by an input signal;

wherein the delay of an output signal of said compensated driver circuit is effected by the width of said pulse output by said control circuit there by modifying the delay of said output signal in response to variations of said at least one parameter.

8. The circuit of claim 2 wherein said compensating element comprises a tri-state driver.

9. The circuit of claim 1 wherein said input circuit comprises a delay element.

10. The circuit of claim 1 wherein said input circuit comprises an element with practically no delay.

11. The circuit of claim 1 wherein:

said pulse generator comprises a delay element with a delay sensitive to said at least one parameter; and a logic gate, wherein the input of said delay element is coupled to a first input of said logic gate and the output of said delay element is coupled to a second input of said logic gate.

12. The circuit of claim 11 wherein said delay element comprises a plurality of serially coupled inverters.

13. The circuit of claim 11 wherein said logic gate comprises a NAND gate or a NOR gate.

14. The circuit of claim 1 wherein said pulse generator comprises:

a first delay element having a first delay;

a second delay element having a second delay, said second delay more sensitive than said first delay to variations caused by said at least one parameter; and a logic element, wherein the output of said first delay element and the output of said second delay element are coupled to said logic gate.

15. The circuit of claim 1 wherein said compensated driver circuit comprises a transistor and an inverter connected such that said control input is coupled to the gate of said transistor and said signal input is coupled to the input of said inverter.

16. The circuit of claim 1 wherein said at least one parameter which causes variations in delay comprises one or more of temperature, supply voltage and transistor gate length.

17. A method for compensating a delay of a driver circuit, where the delay varies due to at least one parameter which causes variations in delay, said method comprising the steps of:

coupling an input signal to said driver circuit;

coupling said input signal to a pulse generator circuit which generates an output pulse upon a transition within said input signal, wherein a width of said output pulse generated by said pulse generator is affected by variations in said at least one parameter; and providing said output pulse to a control input of said driver circuit such that a delay of a signal output from said driver circuit is controlled by the width of said output pulse.

18. The method of claim 17 wherein said at least one parameter which causes variations in delay comprises one or more of temperature, supply voltage and transistor gate length.

19. The method of claim 17 wherein said method compensates the delay of a low-to-high transition but not a high-to-low transition in said input signal.

20. The method of claim 17 wherein said method compensates the delay of a high-to-low transition but not a low-to-high transition in said input signal.

21. The method of claim 17 wherein said method compensates the delay of a high-to-low transition in said input signal and the delay of a low-to-high transition in said first input signal.

22. A circuit which compensates for temperature caused variations in delay comprising:

a control circuit for receiving a control signal, said control circuit including a pulse generator circuit which generates a pulse upon a transition within said control signal, wherein the width of said pulse output by said control circuit is sensitive to variations in temperature;

a compensated driver circuit with a control input coupled to said control circuit and with a signal input coupled to an input circuit, wherein the delay of an output signal of said compensated driver circuit is affected by the width of said pulse output by said control circuit thereby modifying the delay said output signal in response to variations in temperature.

23. The circuit of claim 22 wherein said circuit further compensates for variations in at least one other parameter.

24. The circuit of claim 23 wherein said at least one other parameter comprises supply voltage.

25. The circuit of claim 23 wherein said at least one other paremeter comprises transistor gate length.

26. A method for compensating a delay of a driver circuit, wherein without compensation the delay varies due to at least one parameter which causes variations in delay, said method comprising the steps of:

applying an input signal to a signal input of said driver circuit;

generating a compensation pulse wherein the width of said compensation pulse is proportional to variations in said parameter; and applying said compensation pulse to a control input of said driver circuit such that the delay of a signal output by said driver circuit is substantially independent of variations in said parameter.

27. The method of claim 26 wherein said parameter comprises one or more of temperature, supply voltage, and transistor gate length.

28. The circuit of claim 1 wherein said pulse generator generates said pulse output by said control circuit in response to a transition within said input signal.

29. The circuit of claim 28 wherein said input signal is coupled directly into an input of said pulse generator circuit.

* * * * *